(12) United States Patent
Kwong et al.

(10) Patent No.: US 7,432,776 B2
(45) Date of Patent: Oct. 7, 2008

(54) DIELECTRIC-FILLED TRANSMISSION LINES

(75) Inventors: Herman Kwong, Kanata (CA); Aneta Wyrzykowska, Dunrobin (CA); Larry Marcanti, Allen, TX (US)

(73) Assignee: Nortel Networks Limited, St. Laurent, Quebec (CA)

( * ) Notice: Subject to any disclaimer, the term of this patent is extended or adjusted under 35 U.S.C. 154(b) by 131 days.

(21) Appl. No.: 10/890,054

(22) Filed: Jul. 13, 2004

(65) Prior Publication Data

US 2006/0012452 A1    Jan. 19, 2006

(51) Int. Cl.
*H01P 3/08* (2006.01)
(52) U.S. Cl. .......................................... 333/1; 333/238
(58) Field of Classification Search ................. 333/238, 333/246, 1
See application file for complete search history.

(56) References Cited

U.S. PATENT DOCUMENTS 6,724,283 B2 * 4/2004 Bergstedt et al. ............ 333/246
6,798,320 B2 * 9/2004 Ida et al. ..................... 333/238

* cited by examiner

*Primary Examiner*—Benny Lee
(74) *Attorney, Agent, or Firm*—Anderson Gorecki & Manaras LLP

(57) ABSTRACT

A printed circuit board transmission line has an outer conductive wall surrounding an inner dielectric core. The transmission line may be disposed inside a grounded shielding to provide a form of coaxial conductor that mitigates cross talk from adjacent transmission lines and EMI. Further, groups of dielectric-core transmission lines may be disposed within a single grounded shield. For example, edge coupled differential pairs may be disposed in parallel with each other on a plane defined by a layer of the printed circuit board, i.e., side-by-side. Further, broadside-coupled differential pairs of dielectric-core transmission lines may be disposed in parallel with each other in a stack which is orthogonal with the plane defined by a layer of the printed circuit board, i.e., one on top of the other. Further, a plurality of dielectric-core transmission lines which may include all or ones of single-ended lines and differential pairs may be disposed within a single grounded shield.

20 Claims, 10 Drawing Sheets

DIELECTRIC-FILLED TRANSMISSION LINES

FIELD OF THE INVENTION

This invention is generally related to electrical conductors, and more particularly to electrical conductors on printed circuit boards.

BACKGROUND OF THE INVENTION

It is generally desirable to provide electronic products in the smallest practical size. Consequently, there is a long term development trend of reducing the size of various electronic components such as integrated circuits, passive components, power supplies, and printed circuit boards. In the case of printed circuit boards, this trend has prompted development of circuit boards with ever-increasing complexity and density. Increases in density are typically associated with reduction of both the width of transmission lines and the separation between transmission lines to the extent practical with existing manufacturing technology. Current manufacturing techniques enable reliable production of printed circuit board with very small transmission lines. While this is beneficial to increasing the density of the circuitry the lines are becoming so small that their electrical properties are an impediment for certain applications. For example, cross-talk between closely spaced transmission lines is an impediment to high data rate transmission applications. Similarly, electromagnetic interference ("EMI") can be a problem for high data rate transmission. Resistive and dielectric losses associated with "skin effect" and transmission line length in relatively narrow conductive traces are also problematic.

SUMMARY OF THE INVENTION

In accordance with the present invention a printed circuit board transmission line has an outer conductive wall surrounding an inner dielectric core. The outer conductive wall may be formed by joining multiple transmission line traces into a single transmission line of rectangular cross-section. The resulting transmission line has a greater conductive surface area for a given area of substrate than a standard conductive trace, and hence mitigates loss due to skin effect. The interior dielectric portion can reduce dielectric loss associated with induced magnetic fields. Dielectric-core transmission lines may be disposed both within inner layers of printed circuit boards and on outer layers of printed circuit boards.

In an alternative embodiment, the dielectric-core transmission line is disposed inside a grounded shielding to provide a form of coaxial conductor that mitigates cross talk from adjacent transmission lines and EMI. The shielding may include a dielectric portion disposed within an outer metallic wall, both of which are disposed around the dielectric-core transmission line.

In one embodiment of the invention edge coupled differential pairs of dielectric-core transmission lines are disposed inside grounded shielding. The edge coupled differential pairs are disposed in parallel with each other on a plane defined by a layer of the printed circuit board, i.e., side-by-side. The paired transmission lines are separated by a dielectric material which may also occupy substantially all of the volume outside of the individual transmission lines and inside the shielding.

In another embodiment of the invention broadside-coupled differential pairs of dielectric-core transmission lines are disposed inside grounded shielding. The broadside-coupled differential pairs are disposed in parallel with each other in a stack which is orthogonal with a plane defined by a layer of the printed circuit board, i.e., one on top of the other. The paired dielectric-core transmission lines are separated by a dielectric material which may also occupy substantially all of the volume outside of the individual transmission lines and inside the shielding.

The edge-coupled and broadside coupled configurations provide common noise rejection. However, because of limitations associated with printed circuit board geometry including layer thickness and trace thickness it may not be practical to form the walls of the transmission lines which are orthogonal with a plane defined by a layer of the printed circuit board with as great a width as the walls of the transmission lines which are parallel with that plane. Consequently, broadside-coupled differential pairs may have a greater coupled surface area relative to edge-coupled differential pairs, e.g., by a ratio of 8:1. The relatively greater coupled surface area results in a relatively cleaner signal transmission. Further, the broadside-coupled configuration occupies less area on a substrate than an edge-coupled configuration with similarly sized transmission lines. However, the relatively greater coupled surface area and thicker substrate may also result in relatively greater signal attenuation per unit length. Those skilled in the art will recognize how to use these different advantages to achieve a desired result for a specific implementation.

In another embodiment of the invention a plurality of dielectric-core transmission lines such as combinations of single-ended transmission lines, differential pairs in either edge-coupled or differential-coupled or mixed architecture, are disposed within a single grounded shielding structure. The resulting group of dielectric-core transmission lines are separated by a dielectric material which may also occupy substantially all of the volume outside of the individual transmission lines and inside the shielding. This embodiment may be employed, for example, for a bus or other group of related transmission lines.

One aspect of the invention is a method for manufacturing the dielectric-core transmission lines and shielding. To form a single-ended dielectric-core transmission line an intermediate layer having an intermediate conductive trace on a substrate is disposed above a lower, ground layer. An upper signal layer having an upper conductive trace of lesser width than the intermediate conductive trace is disposed over the intermediate layer such that the upper conductive trace is substantially centered over the intermediate conductive trace. Note that the upper and intermediate conductive traces are now separated by a dielectric. A controlled-depth laser cut or mechanical mill is then made along both edges of the upper conductive trace. In particular, trenches reaching to the intermediate conductive trace are formed on either side of the upper conductive trace. Sidewalls connecting the upper and intermediate conductive traces are then formed in the trenches by filling the trenches with conductive paste or other conductive material, or alternatively by electro-less or electroplate deposition of a conductive material such as copper. It should be noted that the relatively lesser width of the upper conductive trace facilitates formation of the trenches and sidewalls by enabling trench formation in a plane orthogonal with the plane defined by a layer of the printed circuit board. Hence, the laser or mechanical milling bit may be situated perpendicular to the top and bottom of the printed circuit board and the relative difference in ablation properties between the substrate and the intermediate conductive trace may be used to advantage.

Shielding may be formed around the resulting dielectric-core transmission line in a similar manner. In particular, an uppermost layer having an uppermost conductive trace of greater width than the intermediate conductive trace is disposed on the uppermost layer such that the uppermost conductive trace is substantially centered over the intermediate conductive trace, after which trenches reaching to the ground layer are formed on either side of the uppermost conductive trace and sidewalls connecting the ground layer and uppermost conductive trace are formed in the trenches. It will now be recognized by those skilled in the art that this technique can be employed to manufacture the various configurations of the invention.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

Figure 1:
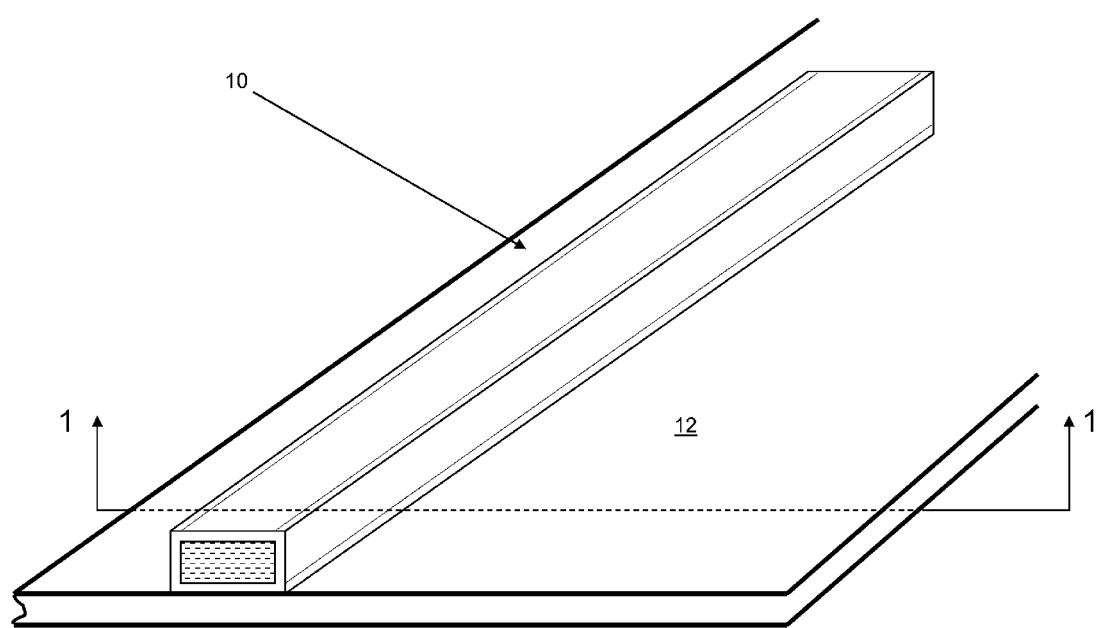
FIG. 1 is a perspective view of a single-ended dielectric-core transmission line.
Figure 2:
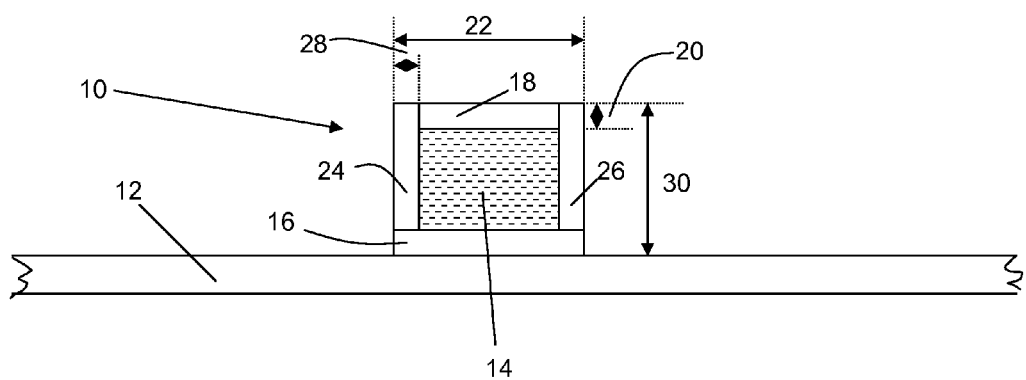
FIG. 2 is a cross-sectional view of the single-ended dielectric-core transmission line of FIG. 1 taken along line 1-1.
Figure 4:
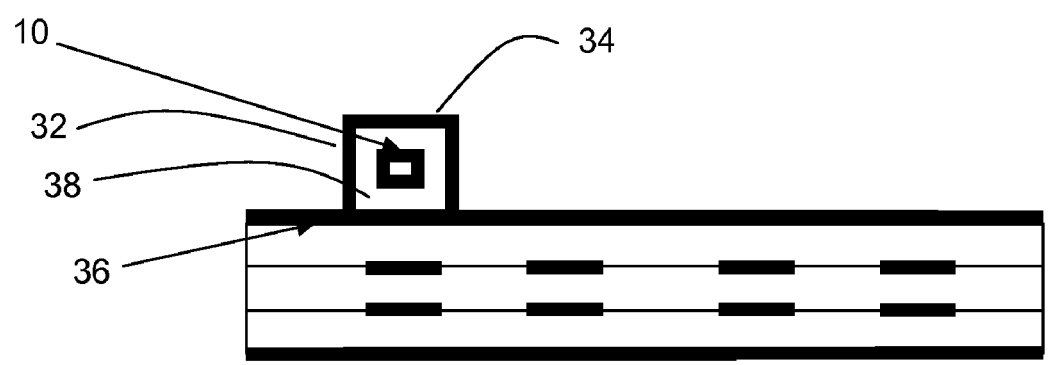
FIG. 4 is a cross-sectional view of the dielectric-core transmission line of FIG. 3 taken along line 3-3.

Referring to FIGS. 1 and 2, a printed circuit board transmission line 10 disposed on a substrate 12 has a tube-like outer conductive wall surrounding an inner dielectric core 14 (see FIG. 4). As seen in FIG. 2, the outer conductive wall includes four conductive sidewalls 16, 18, 24, 26 which are connected to form a continuous, uninterrupted structure having a rectangular cross-section. It should be noted however that other cross-sectional geometries including but not limited to triangular, circular, and any four-sided structure may be employed. First and second ones of the sidewalls 16, 18 are formed from copper or other electrically conductive material in a manner known for formation of conductive traces on a substrate layer of a printed circuit board. Further, the first and second sidewalls may have a thickness 20 similar to known conductive traces, such as 10-25 microns. The conductive wall has a width 22 similar to known conductive traces, such as 50-400 microns. Third and fourth sidewalls 24, 26 may be formed from copper, conductive paste, or any other suitable electrically conductive materials. The third and fourth sidewalls may have a thickness 28 similar to the first and second sidewalls, depending on the electrical and mechanical properties of the materials used. The conductive wall has a height 30 such as 25-75 microns. The dimensions used for a particular implementation will be selected based on material properties, purpose, and intended result, and may be different than the ranges of these examples.

The single-ended transmission line 10 provides improved performance because of increased outer surface area of the conductor relative to a typical conductive trace. For example, the transmission line has a greater outer surface area than a single conductive trace of width and thickness similar to one of the sidewalls. In practice, this relative increase in surface area yields improved electrical properties relative to the conductive trace having lesser surface area because of the "skin effect." The skin effect is a well known and studied phenomenon. In brief, electrical currents such as signals in conductive traces generate magnetic fields. As a signal is transmitted, there is a delay in the response of the magnetic field to changes in current associated with signal transmission, which in turn tends to push current flow towards the outside of the conductive trace. The effect increases with frequency and at very high frequencies, e.g., 10 GHz or 10 Gbps, current only flows through a thin skin on the outer surface of the conductive trace. Hence, the useful cross-sectional area of the conductor is effectively reduced such that undesirable impedance is increased as frequency is increased. The transmission line of the present invention thus mitigates the increase in impedance by increasing the outer surface area relative to a conductive trace occupying a similar amount of substrate surface area.

The dielectric material in the interior portion 14 of the transmission line further enhances the electrical properties of the transmission line. For example, the interior dielectric portion reduces "dielectric loss" because the induced magnetic fields described above are partially dependent on the dielectric constant of the conductor core. By employing a dielectric material such as thermoplastic polymer modified epoxy resin and glass cloth (e.g., FR4, FR5), polytetrafluoroethylene ("Teflon®"), helium gas, nitrogen gas, ceramics, mica, polyethylene, glass, and metal oxides or other materials having similar dielectric constant, the magnitude of the induced magnetic field is reduced, thereby reducing loss.

Figure 3:
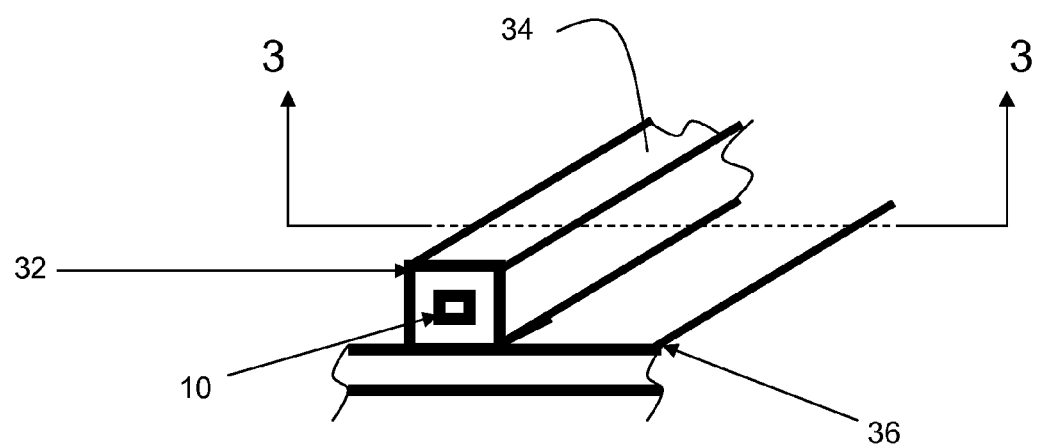
FIG. 3 is a perspective view of a dielectric-core transmission line disposed in a grounded shielding structure.

Referring to FIGS. 3 and 4, in which the conductive wall is depicted with solid lines, the dielectric-core transmission line 10 may be disposed inside a grounded shielding 32 to provide a form of coaxial conductor that mitigates both cross talk from adjacent transmission lines and EMI. The grounded shielding may be formed in accordance with techniques described in U.S. Pat. No. 6,444,922 entitled ZERO CROSS-TALK SIGNAL LINE DESIGN which is incorporated herein by reference. For example, the shielding 32 may be formed from electrically conductive metals by disposing a conductive trace 34 adjacent with a ground layer 36, and metallizing trenches formed between the trace 34 and ground plane 36 to form a continuous, uninterrupted grounded shield. The area outside the transmission line 10 and inside the grounded shielding 32 is filled with a dielectric material 38 (see FIG. 4) such as FR4, Teflon, or other material with suitable properties which can increase line propagation speed as described in the '922 patent.

Figure 5:
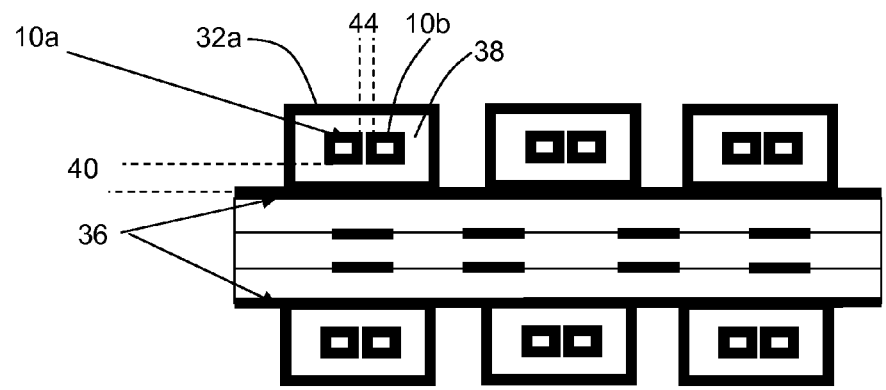
FIG. 5 is a cross-sectional view of edge-coupled differential pairs of dielectric-core transmission lines.

Referring to FIG. 5, dielectric-core transmission lines 10a, 10b may be implemented as edge-coupled differential pairs. The edge-coupled differential pairs 10a, 10b are disposed in parallel with each other on a plane defined by a layer 40 of the printed circuit board, i.e., side-by-side. The distance 44 between the transmission lines 10a, 10b may be selected to achieve the desired coupling effect. The transmission lines are disposed within shielding 32a which is grounded via connection with a ground layer 36 of the printed circuit board. Dielectric material 38 is disposed throughout substantially all of the volume outside of the individual transmission lines and inside the shielding. Consequently, while the transmission lines 10a, 10b in the pair are coupled, they are also shielded from EMI and cross-talk from adjacent transmission lines.

Figure 6:
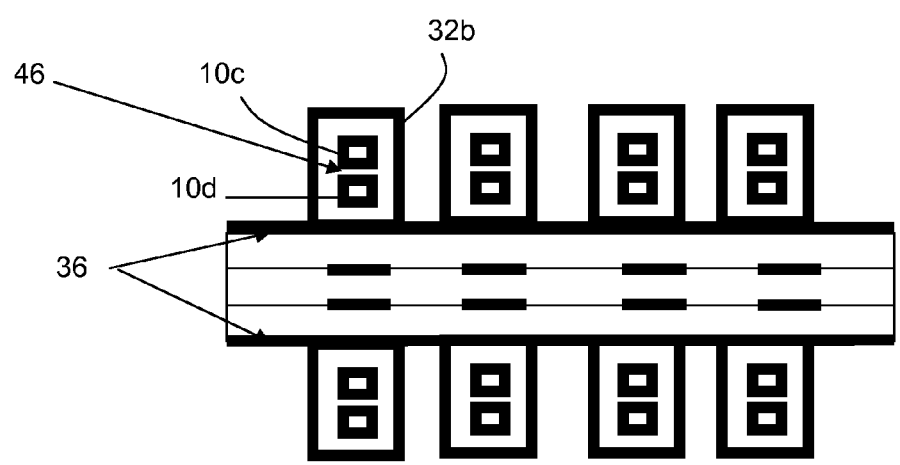
FIG. 6 is a cross-sectional view of broadside-coupled differential pairs of dielectric-core transmission lines.

FIG. 6 illustrates broadside-coupled differential pairs of dielectric-core transmission lines 10c, 10d disposed inside grounded shielding 32b. The broadside-coupled differential pairs are disposed in parallel with each other in a stack formation which is orthogonal with the plane defined by a layer (e.g., ground layer 36) of the printed circuit board, i.e., one on top of the other. The distance 46 between the transmission lines 10c, 10d may be selected to achieve the desired coupling effect. As with the edge-coupled pairs (FIG. 5), shielding 32b is provided via connection with a ground layer 36 of the printed circuit board. Also similarly, dielectric material is disposed throughout substantially all of the volume outside of the individual transmission lines and inside the shielding. Consequently, while the transmission lines in the pair are coupled, they are also shielded from EMI and cross-talk from adjacent transmission lines.

The edge-coupled and broadside coupled configurations of FIGS. 5 and 6 have some different advantages. Because of limitations associated with printed circuit board geometry, including layer thickness and trace thickness, it may not be practical to form the third and fourth sidewalls with as great a width as the first and second sidewalls. Consequently, broadside-coupled differential pairs may have a greater coupled surface area relative to edge-coupled differential pairs, e.g., by a ratio of 8:1. The relatively greater coupled surface area of broadside-coupled transmission lines results in a relatively cleaner signal transmission, assuming equal transmission line dimensions. However, the relatively greater coupled surface area may also result in relatively greater signal attenuation per unit length. Those skilled in the art will recognize how to use these different advantages to achieve a desired result for a specific implementation.

Figure 7:
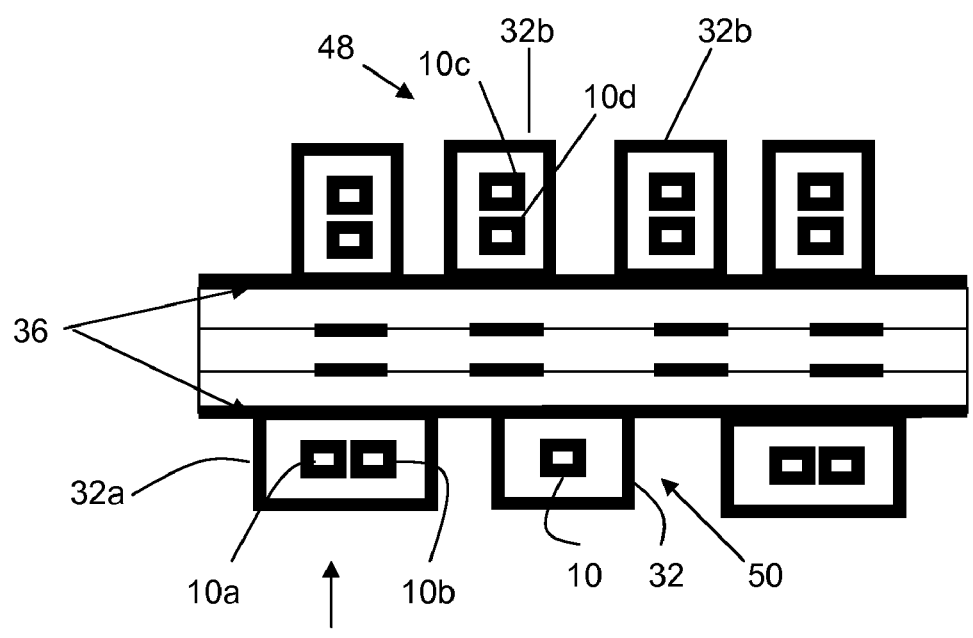
FIG. 7 is a cross-sectional view of mixed broadside-coupled and edge-coupled differential pairs of dielectric-core transmission lines.

Referring to FIG. 7, the edge-coupled 47 broadside coupled 48 and single-ended 50 transmission line configurations may be used in combination in a single implementation. The transmission lines 10, 10a, 10b, 10c, 10d, shielding 32, 32a, 32b, and ground layer 36 are as already described above and illustrated in FIGS. 1-6. As described above, each of the configurations has particular uses and advantages which may be employed to achieve desired results. Any combination of the configurations may be employed on a given layer and in a given printed circuit board to achieve those results for various different signal connections. Further, each of the edge coupled, broadside-coupled and single-ended transmission line configurations may be employed in inner layers of multi-layer printed circuit boards and also on outer layers.

Figure 8:
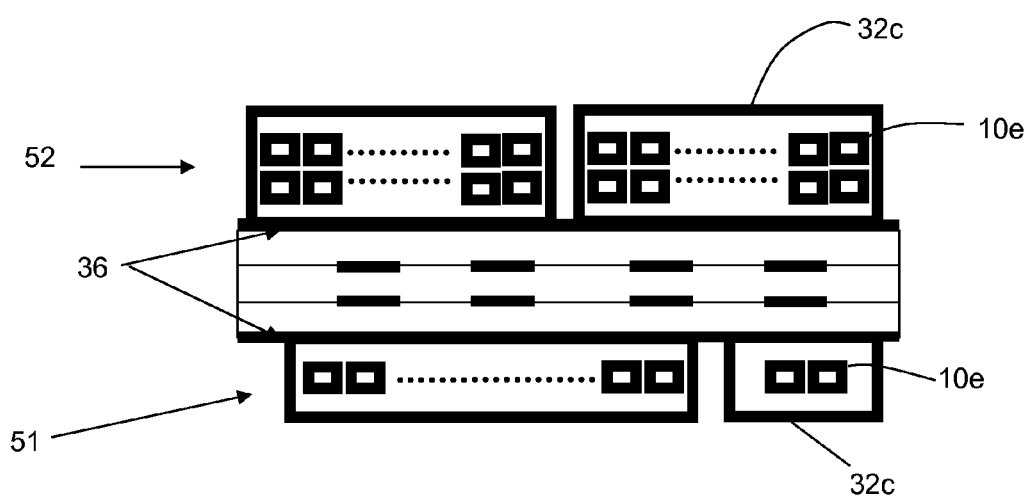
FIG. 8 is a cross-sectional view of mixed broadside-coupled and edge-coupled multiple transmission line structures.

Referring to FIG. 8, in another configuration a plurality of dielectric-core transmission lines 10e are disposed within a single grounded shielding structure 32c. The transmission lines may include a plurality of all or ones of single-ended transmission lines and differential pairs in either edge-coupled, broadside-coupled, or mixed groupings. Further, the transmission lines 10e may be disposed in a single layer array 50 similar to the edge-coupled configuration, and a two layer array 52 similar to the broadside-coupled configuration. The resulting group of dielectric-core transmission lines are separated by a dielectric material which occupies substantially all of the volume outside of the individual transmission lines and inside the shielding. This embodiment may be employed, for example, for a bus or other related group of signals.

Figure 9:
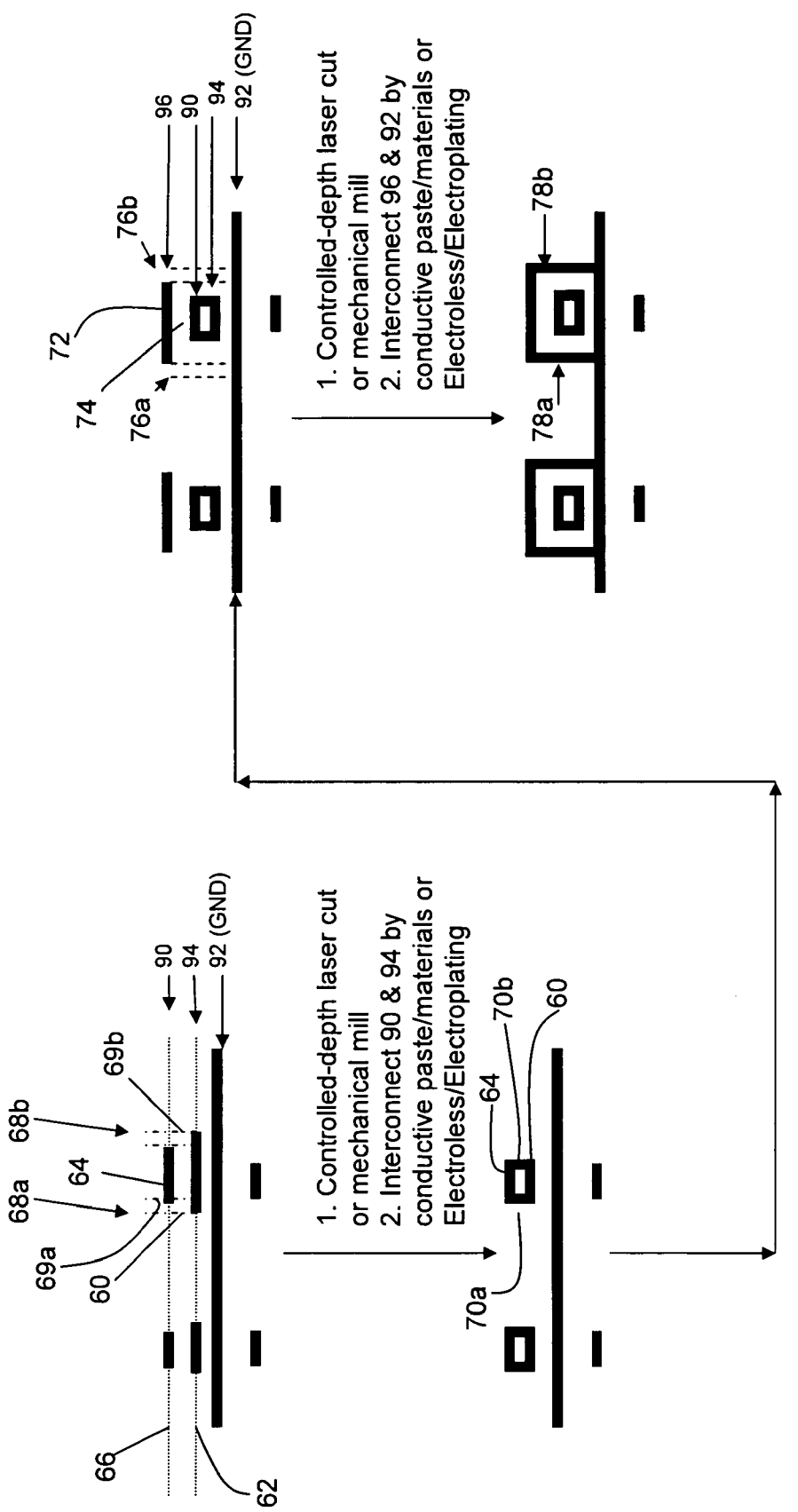
FIG. 9 is a process diagram illustrating manufacture of shielded dielectric-core transmission lines in cross-section.

Referring to FIG. 9, one aspect of the invention is a method for manufacturing the dielectric-core transmission lines and shielding. To form a single-ended dielectric-core transmission line 10 in shielding 32 (See FIGS. 2 and 3), a first layer 90 having a first conductive trace 60 on a substrate 62 is disposed on a ground (GND) layer 92. A second layer 94 having a second conductive trace 64 of lesser or equal width than the first conductive trace 60 on a dielectric substrate 66 is disposed on the first layer such that the second conductive trace is substantially centered over the first conductive trace. The first and second layers are then bonded, such as by subjecting them to heat and pressure. Hence, the bonded first and second conductive traces are separated by the dielectric substrate 66 of the second layer 94. The process also includes dielectric and foil lamination, and circuit patterning of the top layer.

Following the bonding process, a controlled-depth laser cut or mechanically milled trench is made along both edges 68a, 68b of the second conductive trace 64. In particular, trenches 69a, 69b are formed which reach through the substrate 66 of the second layer S1 to the first conductive trace 60 substantially along the edges 68a, 68b of the second conductive trace 64. Sidewalls 70a, 70b connecting the first and second conductive traces 60, 64 are then formed in the trenches by filling the trenches with conductive paste or other electrically conductive material, or alternatively by electroless or electroplate deposition of a conductive material such as copper. It should be noted that if unequal conductor widths are employed the relatively lesser width of the second conductive trace 64 facilitates formation of the trenches and sidewalls by enabling the trench formation in a plane orthogonal with the plane defined by a layer of the printed circuit board. Hence, the laser or mechanical milling bit may be situated perpendicular to the plane defined by the printed circuit board and the relative difference in ablating properties between the substrate and the first conductive trace may be used to advantage. However, it should be noted that conductive traces 60 and 64 may have equal widths and the trench cutting/ablating process may partially cut through the second conductive trace 64 or be disposed at an angle which is not perpendicular with the traces. Indeed, various cross-sectional shapes may be employed to achieve the desired result.

Shielding around the resulting dielectric-core transmission line may be formed in a similar manner. In particular, a third layer 96 having a third conductive trace 72 of greater width than the first conductive trace 60 on a dielectric substrate 74 is disposed on layer 96 such that the third conductive trace is substantially centered over the first conductive trace, after which trenches 76a, 76b reaching to ground (GND) layer 92 are formed (e.g., by controlled depth laser cutting or mechanical milling) on either side of the third conductive trace, and sidewalls 78a, 78b connecting the ground layer and third conductive traces are formed in the trenches (e.g., by using conductive paste or electrodeless electroplating). It will now be recognized by those skilled in the art that this technique can be employed to manufacture the various configurations of the invention.

Figure 10:
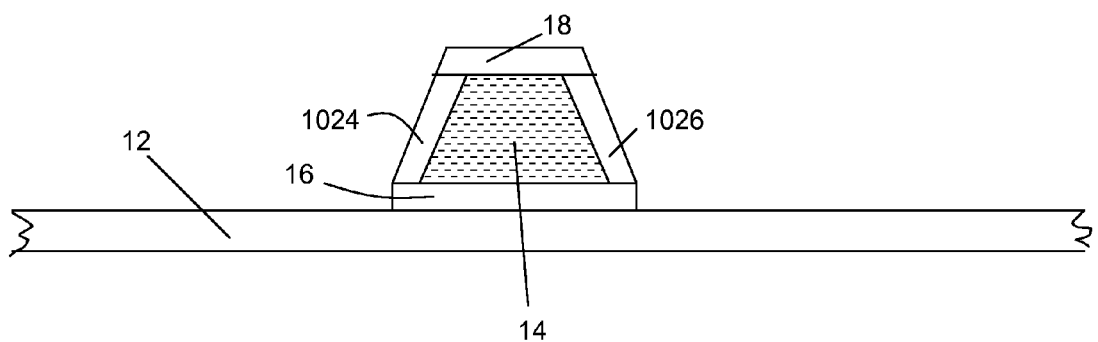
FIG. 10 illustrates a trapezoidal shielded dielectric-core transmission line.

FIG. 10 illustrates a trapezoidal shielded dielectric-core transmission line constructed using the same techniques described above. As in the previously described embodiment, there is a substrate 12, dielectric core 14, and four conductive sidewalls 16, 18, 1024 and 1026. This embodiment differs from that of FIG. 2 only in that walls 1024 and 1026 are not parallel.

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative structures, one skilled in the art will recognize that the system may be embodied using a variety of specific structures. Accordingly, the invention should not be viewed as limited except by the scope and spirit of the appended claims.

What is claimed is:

1. A printed circuit board comprising:
   a first electrical transmission line including:
   an electrically conductive, tube-like outer wall connected to an electrical signal source, wherein the outer wall includes first and second non-parallel sidewalls, and third and fourth non-parallel sidewalls, wherein said first and third sidewalls include electrically conductive traces disposed on first and second printed circuit board inner substrate layers, respectively; and
   a dielectric material disposed inside the outer wall,
   whereby electrical signals may be transmitted via the outer wall, and whereby an increase in transmission line impedance due to skin effect is mitigated.

2. The printed circuit board of claim 1 wherein the second and fourth sidewalls include a material selected from the group consisting of copper and conductive paste.

3. The printed circuit board of claim 1 wherein the outer wall defines a trapezoidal cross-section.

4. The printed circuit board of claim 1 wherein the dielectric material is selected from the group consisting of thermoplastic polymer modified epoxy resin and glass cloth, FR4, FR5, polytetrafluoroethylene, helium gas, nitrogen gas, ceramics, mica, polyethylene, glass, and metal oxides.

5. The printed circuit board of claim 1 wherein the outer wall defines a rectangular cross-section.

6. The printed circuit board of claim 1, further including a grounded shielding disposed around, but not in contact with, the outer wall.

7. The printed circuit board of claim 6 further including a dielectric material disposed between the shielding and the outer wall.

8. The printed circuit board of claim 7 wherein the shielding includes first and second parallel sidewalls, and third and fourth parallel sidewalls, the first and second sidewalls being perpendicular to the third and fourth sidewalls such that the shielding defines a rectangular cross-section.

9. The printed circuit board of claim 8 further including a second transmission line disposed in parallel with, but not in contact with, the first transmission line on a plane defined by a layer of the printed circuit board, such that the first and second transmission lines are side-by-side, and further such that both the first and second transmission lines are disposed within the shielding.

10. The printed circuit board of claim 8 further including a second transmission line disposed in parallel with, but not in contact with, the first transmission line in a stack formation which is orthogonal with a plane defined by a layer of the printed circuit board, such that the second transmission line is on top of the first transmission line, and farther such that both the first and second transmission lines are disposed within the shielding.

11. The printed circuit board of claim 8 further including a plurality of transmission lines disposed in parallel with, but not in contact with, the first transmission line such that the first transmission line and the plurality of transmission lines are disposed within the shielding.

12. A method for manufacturing transmission lines for transmission of electrical signals comprising the steps of:
    bonding a first inner layer having a first conductive trace on a first dielectric substrate to a second inner layer having a second conductive trace on a second dielectric substrate, where the width of the first conductive trace is less than the width of the second conductive trace, such that the first conductive trace is substantially centered over the second conductive trace;
    forming a first trench along a first edge of the first conductive trace through the first substrate to the second conductive trace;
    forming a second trench along a second edge of the first conductive trace through the first substrate to the second conductive trace;
    forming sidewalls connecting the first and second conductive traces by filling the trenches with an electrically conductive material, thereby providing a tube-like transmission line and;
    connecting the transmission line to an electrical signal source;
    whereby an increase in transmission line impedance due to skin effect is mitigated.

13. The method of claim 12 including the further step of forming shielding around the transmission line.

14. The method of claim 13 including the further step of forming first and second transmission lines in parallel, but not in contact with the tube-like transmission line, on a plane defined by a first layer at the bonded first and second substrates such that both the first and second transmission lines are disposed within the shielding.

15. The method of claim 13 including the further step of forming first and second transmission lines in parallel, but not in contact with the tube-like transmission line, in a stack formation which is orthogonal with a plane defined by a first layer at the bonded first and second substrates, such that both the first and second transmission lines are disposed within the shielding.

16. The method of claim 13 including the further step of forming a plurality of transmission lines in parallel, but not in contact with the tube-like transmission line, such that the plurality of transmission lines are disposed within the shielding.

17. The method of claim 12 wherein an interior portion of the tube-like transmission line contains a material selected from the group consisting of: thermoplastic polymer modified epoxy resin and glass cloth, FR4, FR5, polytetrafluoroethylene, helium gas, nitrogen gas, ceramics, mica, polyethylene, glass, and metal oxides.

18. The method of claim 12 wherein the first and second conductive traces are copper.

19. The method of claim 12 wherein the sidewalls are a material selected from the group consisting of conductive paste and copper.

20. The method of claim 12 wherein the step of forming sidewalls includes a process selected from the group consisting of electro-less and electroplate deposition.

* * * * *